US006312966B1

(12) United States Patent
Tseng

(10) Patent No.: US 6,312,966 B1
(45) Date of Patent: Nov. 6, 2001

(54) METHOD OF FORMING SHARP TIP FOR FIELD EMISSION DISPLAY

(75) Inventor: Horng-Huei Tseng, Hsinchu (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 09/690,909

(22) Filed: Oct. 17, 2000

(51) Int. Cl.[7] .................... H01L 21/00

(52) U.S. Cl. .................... 438/20; 313/309

(58) Field of Search .................... 438/22, 20, 34; 257/10; 313/309

(56) References Cited

U.S. PATENT DOCUMENTS 6,064,145 * 5/2000 Lee .................... 313/309
6,181,060 * 1/2001 Rolfson .................... 313/495

* cited by examiner

*Primary Examiner*—David Nelms
*Assistant Examiner*—Quoc Hoang
(74) *Attorney, Agent, or Firm*—Blakely Sokoloff Taylor & Zafman, LLP

(57) ABSTRACT

The present invention comprises forming a first conductive layer over the substrate to have a gap. A dielectric layer is then formed on the first conductive layer. A portion of the dielectric layer is removed to leave a residual dielectric layer in the gap. Next, isotropical etching is performed to etch the first conductive layer using the residual dielectric as an etching mask, thereby forming a conductive tip. A polishing stopper composed of oxide is formed over the conductive tip. A nitride layer is formed over the conductive tip and on the polishing stopper. The nitride is polished to the surface of the polishing stopper. A portion of the nitride layer is etched to form a step over the conductive tip. A second conductive layer is formed over the etched nitride layer. A portion of the second conductive layer is removed to expose an upper surface of the step. The nitride layer and the polishing stopper are respectively removed to expose the conductive tip.

10 Claims, 4 Drawing Sheets

METHOD OF FORMING SHARP TIP FOR FIELD EMISSION DISPLAY

FIELD OF THE INVENTION

The present invention relates generally to a field emission display device, and more specifically, to a method of forming sharp tip for field emission display device.

BACKGROUND OF THE INVENTION

Flat panel displays are widely used in a variety of applications, including computer displays. The flat panel display includes liquid crystal, plasma displays and a field emission display. The recent researches and development of display devices have been directed for thinner display structures. Under the consideration, the field emission displays (FED) having field emission cathodes have been one of the candidates. The field emission display device is a flat display device with a tip for emitting electrons. They are highly expected to be applicable in the area of a display of television pictures such as public relations display units. The FED is a flat CRT (cathode ray tube) having a field emission cathode, and an anode electrode and phosphors disposed opposite the field emission cathode in a position corresponding to each pixel.

Field emission displays typically include a generally planar substrate having an array of electron emitters. In many cases, the emitters are conical projections integral to the substrate. In the FED, electrons emitted from the field emission cathode are accelerated by an electric field between the field emission cathode and anode electrode and impact upon the phosphors which will be excited to emit light and display an image. In a conventional color display, each localized portion of the cathodoluminescent layer forms a green, red or blue sub-pixel of the color display.

To produce these emissions, FEDs have generally used a multiplicity of x-y addressable cold cathode emitters. There are a variety of designs such as point emitters, in which requisite electric field can be achieved at lower voltage levels. Each FED emitter is typically a miniature electron gun of micron dimensions. When a sufficient voltage is applied between the emitter tip and an adjacent extraction gate, electrons quantum mechanically tunnel out of the emitter. Generally, the anode is a transparent electrically conductive layer such as indium tin oxide (ITO) applied to the inside surface of a faceplate, as in a CRT. The field emission cathode used in the field emission type flat CRT of this type utilizes the tunnel effect of the electrons in a strong electric field. The electron-emitting materials include a high melting-point metals such as Mo, Ni, W, etc., and Si, etc.

FEDs require no heat or energy when they are off. When they operate, nearly all of the emitted electron energy is dissipated on phosphor bombardment and the creation of emitted unfiltered visible light. FEDs have the further advantage of a highly nonlinear current-voltage field emission characteristic, which permits direct x-y addressability without the need of a transistor at each pixel. Also, each pixel can be operated by its own array of FED emitters activated in parallel to minimize electronic noise and provide redundancy, so that if one emitter fails the pixel still operates satisfactorily.

The U.S. Pat. No. 5,608,283 discloses a field emission cathode plate in which particles of graphite, amorphous carbon or silicon carbon are provided on high-resistance pillars formed on a conductive layer provided on a substrate or directly on the conductive layer via an adhesive layer.

Further, U.S. Pat. No. 6,095,882 to Wells, et al., entitled "Method for forming emitters for field emission displays". The method includes forming a hard mask layer on a substrate used to form emitters. On the hard mask layer, a photoresist layer is deposited. Islands of photoresist are exposed by an exposing energy through holes in a mask layer. Following the soft-bake, the substrate is flood exposed, and then developed, leaving behind hardened islands of exposed and baked photoresist. The hard mask layer is etched using the hardened islands as an etching barrier, and the substrate etched using the etched hard mask layer as an etching barrier. The etching continues until the substrate material below the etched hard mask layer is formed into an array of points of substrate. Once these emitter sites are formed, a field emission display having uniform emitters can be created.

In U.S. Pat. No. 6,116,975, the inventor disclosed a method of forming the field emission cathode. Sandhu, et al., disclosed a method of forming field emission device in U.S. Pat. No. 6,086,442, entitled" Method of forming field emission devices". Also, the field emission cathode plate disclosed in the United States Patent is characterized in that the conductive particles are bonded to the conductive layer with a conductive adhesive. However, there is a large likelihood that the conductive adhesive material is likely to cover the conductive particles. In this case, electrons will not be emitted. It is difficult to dispose conductive particles selectively on the high-resistance pillars by the ordinary layer forming and printing techniques. U.S. Pat. No. 6,064,145 discloses a method of forming the tips for emitting. However, it includes a critical step to polish a dielectric layer and stop over the tip about 100 angstroms. As know in the technique, it is unlikely to control the CMP (chemical mechanical polishing) within such degree due to the 100 ANG may be the tolerance of the CMP. Therefore, this control is extremely difficult.

SUMMARY OF THE INVENTION

An object of the present invention is to manufacture tip of the field emission display device.

The present invention comprises providing a substrate having a trench. A first conductive layer is formed over the substrate to have a gap over the trench. A first dielectric layer is then formed on the first conductive layer. A portion of the first dielectric layer is removed to leave a residual dielectric layer in the gap. Next, isotropical etching is performed to etch the first conductive layer using the residual dielectric as an etching mask, thereby forming a conductive tip. A polishing stopper is formed over the conductive tip. A second dielectric layer is formed over the conductive tip and on the polishing stopper. The second dielectric layer is polished to the surface of the polishing stopper for preventing the conductive tip from being damage. A portion of the second dielectric layer is etched to form a step over the conductive tip. A second conductive layer is formed over the etched second dielectric layer. A portion of the second conductive layer is removed to expose an upper surface of the step. The second dielectric layer is etched using the second conductive layer as an etching mask. The polishing stopper is removed to expose the conductive tip.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
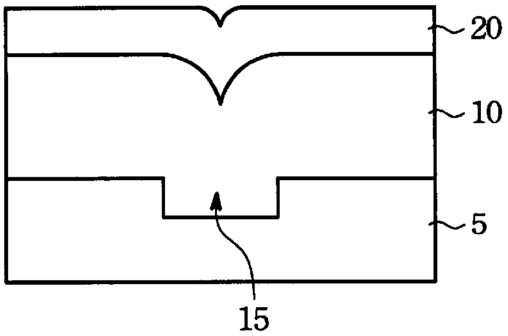
FIG. 1 s a cross section view of a semiconductor wafer illustrating a dielectric layer formed on a conductive layer in accordance with the present invention.
Figure 2:
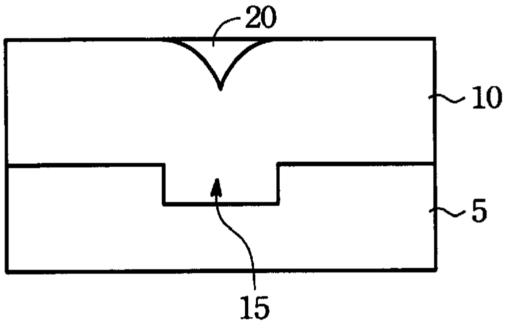
FIG. 2 a cross section view of a semiconductor wafer illustrating the step of performing CMP to polish the dielectric layer in accordance with the present invention.

A method is disclosed to form the field emission display device using a polishing stop layer. Referring to FIG. 1, in the preferred embodiment, a semiconductor wafer, such as a silicon wafer 5 with <100> crystallographic orientation is provided. As known in the art, the substrate could be GaAs, Ge and so on. FIG. 1 is a cross-sectional view illustrating an embodiment of the present invention. The substrate includes a trench 15 formed therein. A conductive layer such as metal or silicon 10 is formed over the substrate 5. Preferably, the conductive layer 10 is formed by epitaxially-grown technique. As seen in the illustration, the conductive layer 10 has a gap formed on the surface due to the trench 15. A dielectric layer 20 is next deposited along the surface of the conductive layer 10. The dielectric layer 20 can be silicon dioxide, silicon nitride, oxynitride or any other dielectric. Subsequently, a planarizing process, such as chemical mechanical polishing (CMP), or etching back is used to remove the dielectric layer 10 to the upper surface of the conductive layer 10 leaving the dielectric layer 20 in the gap over the trench 15, as shown in FIG. 2.

Figure 3:
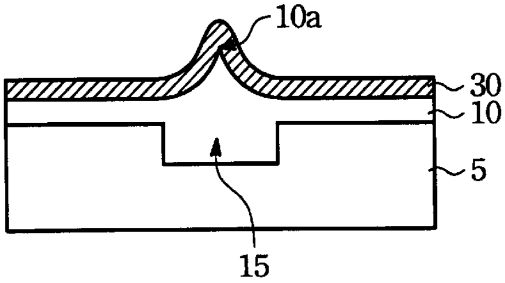
FIG. 3 is a cross section view of a semiconductor wafer illustrating the step of forming polishing stopper in accordance with the present invention.
Figure 4:
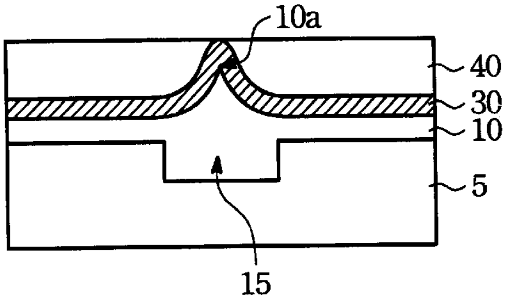
FIG. 4 is a cross section view of a semiconductor wafer illustrating the step of forming a second dielectric layer in accordance with the present invention.

Turning to FIG. 3, the residual dielectric layer 20 in the gap as a masking and may be etchable to a certain etching recipe. Then, an isotropic etching is used to etch the conductive layer 10 and the residual masking cap 20. A Tip 10*a* is formed and cap 20 is striped under such circumstance. A polishing stop layer 30 is then next formed on the tip 10*a* and the etched surface of the conductive layer 10, as shown in FIG. 3. In one embodiment, a deposited layer such as oxide may be used as the polishing stop layer 30. Further, a thermal process may be used to convert the silicon into the oxide as the stopper. For example, the oxide is typically formed by using a thermal oxidation procedure in an oxygen steam ambient. Alternatively, the oxide layer may be formed using any suitable oxide chemical compositions and procedures.

Next, a thick nitride layer 40 is deposited on the resulting structure. Then, CMP is carried out to remove the nitride 40 to stop on the polishing stop layer 30. The CMP polishing stop layer 30 prevents the tip 10*a* from being damage. The silicon nitride layer 40 can be deposited by any suitable process. For example, low pressure chemical vapor deposition (LPCVD), plasma enhanced chemical vapor deposition (PECVD), or high density plasma chemical vapor deposition (HDPCVD) may be used. In the preferred embodiment, the reaction gases used to form silicon nitride layer 8 are $SiH_4$, $NH_3$, $N_2$, $N_2O$ or $SiH_2Cl_2$, $NH_3$, $N_2$, $N_2O$.

Figure 5:
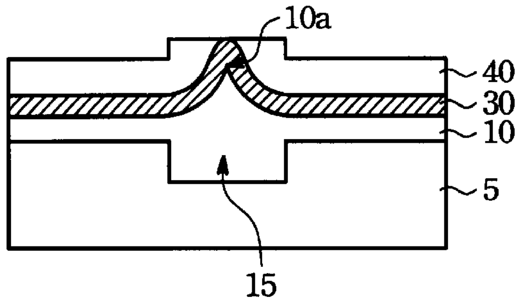
FIG. 5 is a cross section view of a semiconductor wafer illustrating the step of etching a portion of the second dielectric layer in accordance with the present invention.
Figure 6A:
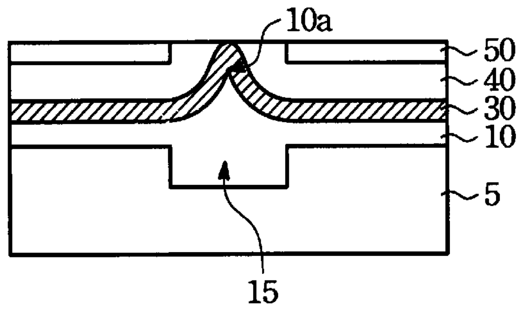
FIG. 6A is a cross section view of a semiconductor wafer illustrating the step of forming a metal layer in accordance with the present invention.
Figure 7A:
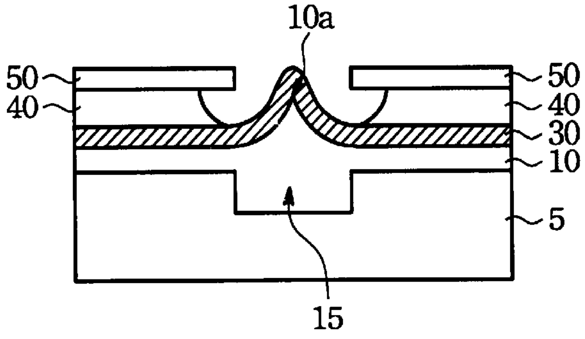
FIG. 7A is a cross section view of a semiconductor wafer illustrating the step of etching the second dielectric layer in accordance with the present invention.
Figure 8A:
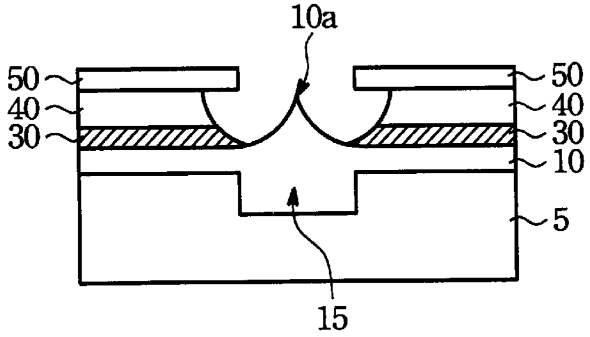
FIG. 8A is a cross section view of a semiconductor wafer illustrating the step of removing the polishing stopper in accordance with the present invention.

As shown in FIG. 5, nitride layer 40 is partially etched to form a step around tip 10*a*. Preferably, this partial etch can use the same photomask used to form the trench 15. Next step please refer to FIG. 6A, a metal layer 50 is formed on the patterned nitride layer 40, then a portion of the metal layer 50 is etched or removed to expose the upper surface aligned to the tip 10*a*. Next, referring to FIG. 7A, the metal layer 50 is used as an etching mask to isotropically etch the nitride layer 40 to expose the polishing sopping layer 30 by using hot phosphorus solution, Then the stopping layer 30 is subsequently removed by HF or BOE solution, thereby exposing the tip 10*a* having a metal ring 50 around the tip 10*a*, as shown in FIG. 8A.

Figure 6:
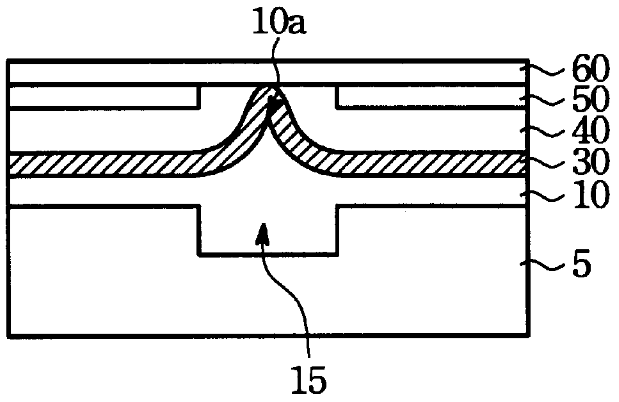
FIG. 6 is a cross section view of a semiconductor wafer illustrating the step of forming a third dielectric layer in accordance with the present invention.
Figure 7:
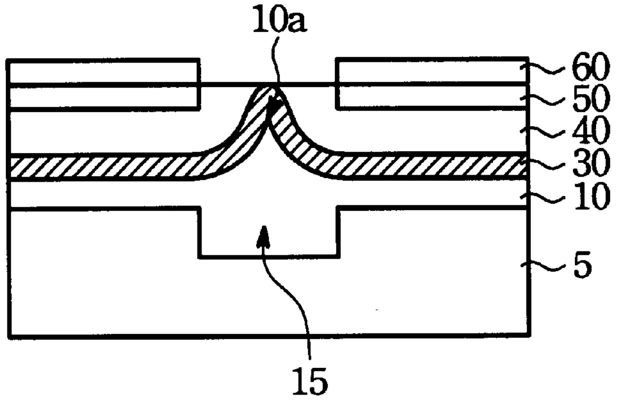
FIG. 7 is a cross section view of a semiconductor wafer illustrating the step of etching the third dielectric layer in accordance with the present invention.
Figure 8:
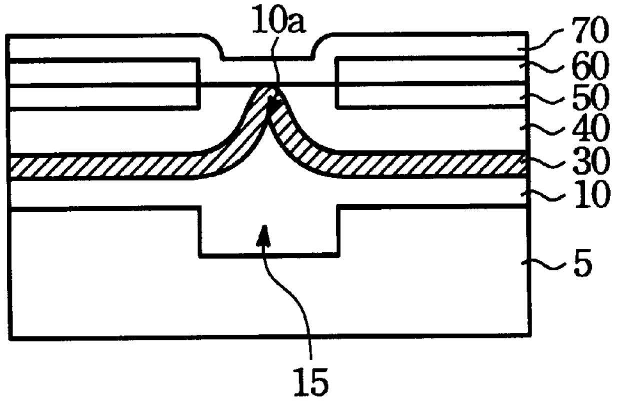
FIG. 8 is a cross section view of a semiconductor wafer illustrating the step of forming the forth dielectric layer in accordance with the present invention.
Figure 9:
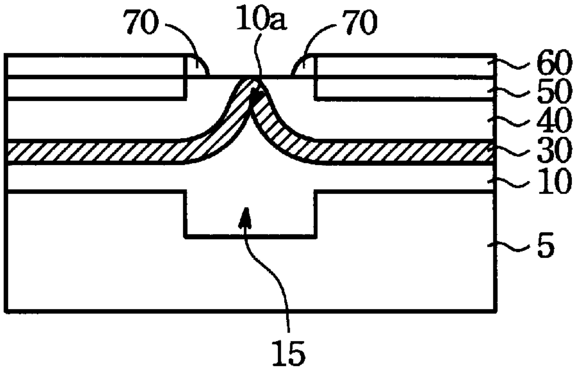
FIG. 9 is a cross section view of a semiconductor wafer illustrating the step of forming spacers in accordance with the present invention.

A further embodiment may be seen as follows. As shown in FIG. 6, a metal 50 is formed on the patterned nitride layer 40. Then, the metal 50 is removed to the upper surface of the nitride layer 40 by etching back or CMP. An oxide layer 60 is next formed over the metal layer 50 and the nitride layer 40. An etching is then used to etch the portion of oxide layer 60 above tip 10*a*, as shown in FIG. 7. Preferably, this partial etch uses the same photomask used to form trench 15 in substrate. Turning to FIG. 8, a further oxide layer 70 is then deposited on the resulting structure. Then, an etching is used to etch the oxide 70 to expose the nitride layer 40 over the tip 10*a*, thereby forming oxide spacers 70, as shown in FIG. 9.

Figure 10:
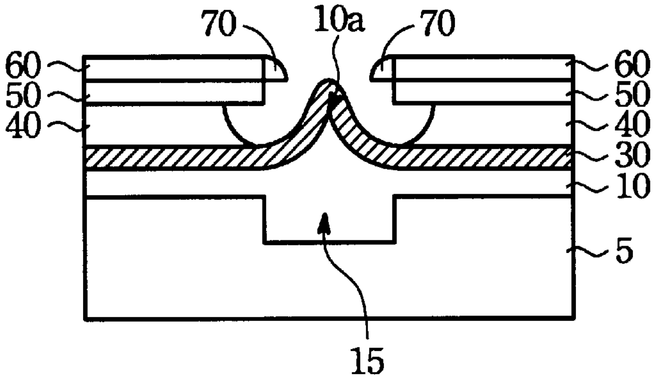
FIG. 10 is a cross section view of a semiconductor wafer illustrating the step of etching the second dielectric layer using the spacer and third dielectric layer as a mask in accordance with the present invention.
Figure 11:
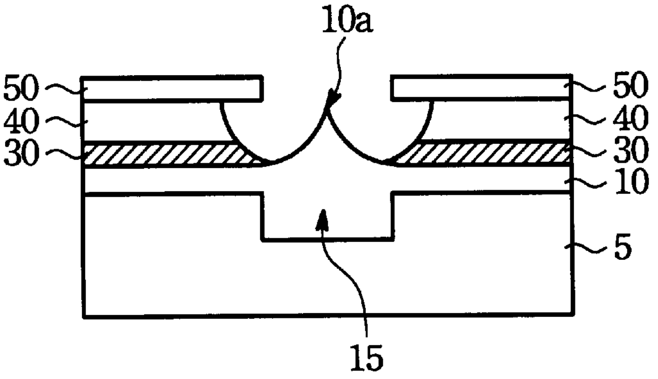
FIG. 11 is a cross section view of a semiconductor wafer illustrating the step of removing the polishing stopper in accordance with the present invention.

As illustrated in FIG. 10, a wet etch is performed using the oxide as etching mask to etch the nitride 40. Hot phosphorus acid solution is introduced to act the etchant. Then, a further wet etching is used to remove the polishing stop layer 30 and the oxide masking 70 by buffered HF solution or BOE (buffered oxide etching), simultaneously, and thereby exposing the tip 10*a*, please refer to FIG. 11. The field emission tip 10*a* having metal ring 50 is therefore formed on the substrate 5.

As is understood by a person skilled in the art, the foregoing preferred embodiment of the present invention is merely illustrative of the present invention. It is intended to cover various modifications and similar arrangements included within the spirit and scope of the appended claims, the scope of which should be accorded the broadest interpretation so as to encompass all such modifications and similar structure. Thus, while the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a field emission tip, said method comprising:

providing a substrate having a trench formed therein;

forming a first conductive layer over said substrate to have a gap over said trench;

forming a first dielectric layer on said first conductive layer;

removing a portion of said first dielectric layer to leave residual dielectric layer in said gap;

isotropically etching said first conductive layer using said residual dielectric as an etching mask, wherein said residual dielectric is etchable during the etching, thereby forming a conductive tip;

forming a polishing stopper over said conductive tip;

forming a second dielectric layer over said conductive tip and on said polishing stopper;

polishing said second dielectric layer to the surface of said polishing stopper for preventing said conductive tip from being damage;

etching a portion of said second dielectric layer to form a step over said conductive tip;

forming a second conductive layer over said etched second dielectric layer;

removing a portion of said second conductive layer to expose an upper surface of said step;

etching said second dielectric layer using said second conductive layer as an etching mask; and removing said polishing stopper on said conductive tip.

2. The method of claim 1, further comprising following steps before etching said second dielectric layer:

forming a third dielectric layer on said second dielectric layer and said upper surface of said step;

etching said third dielectric layer to have an opening over said conductive tip;

forming a fourth dielectric layer on said third dielectric;

anisotropically etching said fourth dielectric layer to form spacers on said opening; and wherein said second dielectric layer is etched by using said third and forth dielectric layer as an etching mask, wherein said forth and third dielectric layer is also removed while said polishing stopper is removed.

3. The method of claim 2, wherein said third and fourth dielectric layer comprise oxide.

4. The method of claim 2, wherein said third and fourth dielectric layer are removed by HF or BOE solution.

5. The method of claim 1, wherein said first conductive layer includes silicon.

6. The method of claim 1, wherein said first dielectric layer includes oxide, nitride or oxynitride.

7. The method of claim 1, wherein said polishing stopper includes oxide.

8. The method of claim 7, wherein said polishing stopper is removed by HF or BOE solution.

9. The method of claim 1, wherein said second dielectric layer includes nitride.

10. The method of claim 9, wherein said second dielectric layer is removed by hot phosphorus acid solution.

* * * * *